METHOD OF FORMING A SEMICONDUCTOR BY MASKING AND DIFFUSING

Filed Oct. 20, 1965

(Actual Size)

INVENTOR.
Peter T. Robinson

BY

Mueller, Aichele & Rauner

ATT'YS.

United States Patent Office 3,418,181
Patented Dec. 24, 1968

3,418,181

METHOD OF FORMING A SEMICONDUCTOR BY MASKING AND DIFFUSING

Peter T. Robinson, Scottsdale, Ariz., assignor to Motorola, Inc., Franklin Park, Ill., a corporation of Illinois Filed Oct. 20, 1965, Ser. No. 498,338
3 Claims. (Cl. 148—187)

ABSTRACT OF THE DISCLOSURE

The manufacture PNP semiconductor structures has as a last procedural step an N type diffusion. The method includes depositing layers of semiconductor by gaseous deposition, diffusing a dopant by gaseous deposition and forming a masking layer with an opening therein. The above steps are performed under certain specified temperature ranges and in certain limits of time.

This invention relates to semiconductor devices and more particularly to semiconductor devices having a PNP configuration.

An advantageous feature in designing electrical circuits is the availability of complementary components. Complementary components are devices, such as PNP and NPN transistors, which have similar physical and electrical characteristics except for the difference in the required bias polarity. The designer has greater latitude in his circuit design and can often reduce power consumption when complementary components are available. The similarity of characteristics is advantageous because this allows the circuit designer to fully utilize the capabilities of the devices in the system. This factor becomes more important in applications where a reduced size is desired, such as integrated circuits. Although many times these complementary devices are not used together in the same circuit, the restriction to one type of device, such as an NPN transistor, throughout a given circuit may create very complex problems that could easily be solved by the substitution of a PNP device. The limitation of available power or the reference voltage of an existing adjacent circuit may create this situation.

Power transistors are an example of a device available in PNP and NPN configurations, but lacking many of the desirable features of complementary devices. Although a high quality silicon NPN power transistor has been available, a similar quality silicon PNP power transistor has not been available. Therefore, it has been necessary to combine silicon and germanium devices in circuits utilizing PNP and NPN devices. Many circuits require all PNP devices and are presently limited, because of cost and operating conditions, to germanium devices. Germanium PNP power transistors lack many of the advantageous characteristics possessed by silicon devices. Silicon devices generally have a safe operating junction temperature approximately 90° to 100° C. higher than the corresponding germanium device. This higher junction temperature often makes this transistor capable of absorbing a greater power surge without failure than a corresponding germanium transistor. Silicon devices generally have a lower leakage current and less variation of leakage current with variations in temperature. Also, silicon devices tend to have breakdown voltages which are approximately 25 to 150 volts higher than germanium devices. These many advantageous characteristics of silicon have made it desirable, in many applications, to substitute silicon devices for germanium devices.

PNP silicon transistors are available for high frequency, low power, applications. For this type of requirement a very large selection of complementary devices of silicon or germanium, are available. High frequency transistors generally have narrow base widths, whereas power transistors have wide base widths. The base width is normally the distance between the collector-base junction and the emitter-base junction. Silicon PNP power transistors for low frequency operation, below about 10 megacycles, have not been as readily available because of increased cost and poorer performance for a given die size.

The power transistor is an extremely efficient and versatile device. These transistors have the capability of producing, in a very efficient manner, substantial power gains. The capability of handling large amounts of power has permitted the design of physically compact circuits having a series operation up to about 300 volts and a parallel current operation exceeding 100 amperes. Of more significance is a power handling capability which is approximately 1 watt to hundreds of watts. Applications include replacement for dynamotors or vibrators in DC to DC converters, regulators and switches.

The construction of an effective low frequency power transistor requires the formation of a device having a large safe operating area. To obtain this safe operating area a wide base device is desirable. Efficient and effective NPN silicon power transistors have been available for some time. However, efficient and effective PNP silicon power transistors have not been as readily available for many power applications. This has been because of the difficulty of constructing a device having a base wide enough to obtain an effective safe area. As the base width increased, the performance would degrade to the point where the use of the transistor was no longer practical. These silicon devices were generally fabricated using diffusion methods or a combination of diffusion and epitaxial deposition to obtain the regions of varying conductivity type.

In the fabrication of a PNP silicon transistor the normal starting material is a P type substrate. The P type region will have a relatively low impurity concentration, commonly referred to as the doping level. This region is lightly doped so that the N type doping level may also be maintained relatively low. In the formation of succeeding regions of different conductivity type by the diffusion process, the concentration of the desired conductivity type must exceed the concentration of the existing conductivity type. The doping level of a multilayer device is normally limited by the solid solubility of the semiconductor material.

As a first step in the fabrication, a glass is thermally grown on the P type substrate and openings made in the glass for the base (N type) regions. Well known photoengraving techniques are commonly used to make these openings and will not be described herein. Gaseous phosphorus, from a $POCl_3$ or $P_2O_5$ source, is a suitable N type dopant to form this region. After the exposed substrate has been treated for the predetermined time and temperature cycle, additional glass is grown on the surface of the silicon. Openings are made in the glass to expose areas for the information of "base contacts." The base contact is a highly doped N type region, designated N+, which aids in the formation of good ohmic contacts when aluminum is used as a contact metal. Since aluminum is a P type dopant, this N+ type region is required to prevent the formation of a PN junction at the contact interface after metallization. A glass is thermally grown to protect the exposed base contact regions after the diffusion is completed. Openings are made in the glass surface over the N type region for a P+ type emitter region. Boron, from a source such as $BBr_3$, is often used as a dopant for this diffusion. The emitter is diffused to the selected depth by following a predetermined time and temperature cycle based upon well known formulas. The transistor is then subjected to various masking, photoengraving and metallizing steps so as to complete the device. These final processing steps and the methods of encapsulating are well known in the semiconductor technology.

A PNP silicon transistor fabricated according to this procedure is generally limited to a maximum base width of about 1 to 2 microns. This transistor may advantageously be used with good response over a board frequency range of about 5 mc. to 50 mc., but has a low safe area limiting its capabilities. When a wide base width PNP power transistor is fabricated in accordance with this technque the efficiency of the device, technically defined as beta which equals $I_C/I_B$, is of such a low value that the device cannot be used effectively.

The problem of forming a suitable NPN structure is not limited to power transistors. In integrated circuits the formation of PNP and NPN devices is often desired because of the severe space limitations imposed upon finished circuit. Although PNP devices may be fabricated in a manner similar to that previously described, they have not functioned in a wholly suitable manner. PNP devices, when formed as part of an integrated circuit, often appear to form an N type channel acros the P type collector regions when aluminum metallization is applied. Although some reduction in this channeling has been realized by the use of heavier insulating layers and wash and bake cycles, a serious lack of reliability is still present.

An object of this invention is to provide a method of manufacturing a wide base PNP semiconductor device which has improved operating characteristics.

Another object of this invention is to provide a method of manufacturing a PNP semiconductor device having an increased minority carrier life time in the N type region.

A further object of this invention is to provide a method of manufacturing a PNP semiconductor device having a stable insulating surface.

Still another object of this invention is to provide a method of manufacturing an integrated type circuit having a minimum number of charged channels after metallization.

A feature of this invention is a method of manufacturing a PNP semiconductor device wherein a high concentration N type diffusion is performed, as the final diffusion, after the formation of a suitable masking layer on the surface of the semiconductor device.

Another feature of this invention is a method of manufacturing a PNP semiconductor device wherein a dense, strong, masking material having a low diffusion rate is deposited on the surface of the device prior to the final diffusion.

Figure 1:
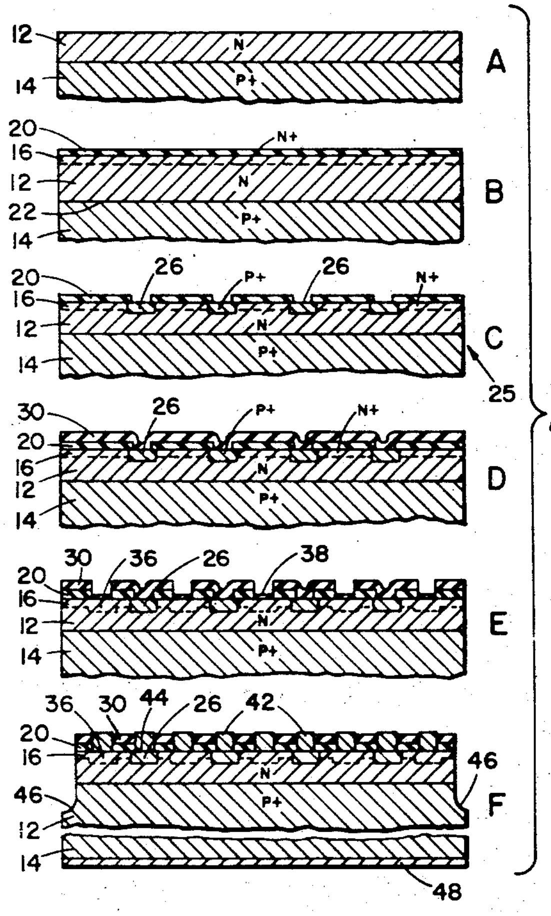
FIG. 1 is a series of enlarged cross-sectional views of showing a semiconductor device at various stages in its manufacture in accordance with one embodiment of this invention.

The present invention is embodied in a method of manufacturing a semiconductor device having alternate type conductivity regions comprising the forming of a wafer with an N type region contiguous with a P type semiconductor substrate, forming a second P type region in the N type region, disposing an insulator in intimate contact with the N type region and the P type region formed therein, and subjecting the insulator and areas of the wafer to an N type dopant, whereby an N type region of higher concentration than the first N type region is formed.

The semiconductor material which is treated in accordance with the present invention is advantageously a single crystal element of silicon, although various semiconductor compounds may be employed. The crystal element is advantageously a wafer which is typically obtained from a larger crystal grown by known crystal pulling or zone melting processes. A suitable quantity of dopant is added to the larger crystal during the pulling or zone refining process to produce the selected initial impurity level and type. The larger crystal is sliced into wafers. The wafers are lapped, polished, and otherwise processed to achieve the final surface finish and shape for the substrate of the proposed device.

The dopant, when added to a semiconductor material generally displays an excess or deficit of electrons. Dopants falling in group V of the period table such as phosphorus, antimony and arsenic, exhibit characteristics indicating that they have an excess of electrons. These are called donor or N type dopants and create N type regions. Dopants falling in group III of the periodic table, such as boron, aluminum and gallium, exhibit characteristics indicating that they have a deficit of electrons. These are known as acceptor or P type dopants and create P type regions. When the amount of impurities added of one type is very high, the region is known as a + region, such as N+ or P+. This type of region will generally have a very low resistivity.

PNP silicon power transistors with base widths in excess of between about 1.5 and 2 microns have been expensive to manufacture and have not yielded betas and safe operating areas as high as desired. PNP power transistors fabricated in accordance with this invention may have base widths up to about 20 microns while maintaining betas of approximately 20 to 500 and high DC safe operating areas. It is believed that the reduction in beta as the base width increases is related to the minority carrier lifetime and mobility in the base region. By increasing the minority carrier lifetime and mobility in the base region it has been found that an effective transistor with a much wider base may be produced.

An important element in the fabrication of a device in accordance with this invention is the capability of depositing a suitable masking material on the surface of the device. Since this mask is to be used as a diffusion mask it should be a strong and dense material with a low diffusion rate for the dopant to be used. Advantageously this mask should be easy and rapid to deposit on the surface of the semiconductor material. Another advantageous property is the capability of forming windows or openings in this mask by simple means such as etching. Silicates or glasses which may be deposited from the vapor state have proven highly satisfactory for this insulating material. Metal masks, such as chromium, may also be used for this function.

One method of depositing this mask is the epitaxial process involving the oxidation of a gaseous compound, such as $SiCl_4$, in a reaction chamber containing the heated wafers, whereby an $SiO_2$ layer is formed on the wafer. Another suitable method utilizes a reaction that takes place at a low temperature of about 300° to 600° C. to oxidize a gaseous compound at atmospheric pressure to form a silicate such as boro-alumina-silicate. These glasses will normally be deposited in thicknesses of between about 2000 and 15,000 angstroms on the surface of the semiconductor device.

The N type region of a PNP device may advantageously be formed by depositing epitaxially an N type layer between about 3 and 30 microns thick. This layer will advantageously have a resistivity of between about .3 and 30 ohm-cm. This resistivity range will yield diode breakdown voltages across the PN junction or a $BV_{CBO}$ of a PNP transistor of about 20 to 300 volts. The base region may also be formed using well known diffusion techniques. The epitaxial method is preferable to the diffusion process because of the ease of fabrication and control of the N type layer resistivity and thickness.

The emitter is formed by a high concentration P type diffusion performed at about 1050° to 1150° C. using an acceptor type dopant, such as boron from a $BBr_3$ source. This diffusion is very efficient in forming the emitter. However, tests indicate that in the previous PNP practice this diffusion subsequent to a high concentration phosphorus base contact diffusion tended to redistribute contaminants which had been "tied-up" by the previous phosphorus contact diffusion.

The base contact diffusion is an essential part of the fabrication of the PNP device when an acceptor type metal is to be used for the contact metallization. Aluminum is an advantageous contact metal to use with silicon devices because it forms a very good ohmic contact with silicon. However, aluminum is a P type dopant and has a tendency to form a PN junction when placed on N type regions. To avoid creating a diode it is common practice to form a highly doped N+ type region for the base contact in an N type base. A dopant which is often used to form the base contact region is phosphorus. The phosphorus also appears to act as a getter or an attractor for contaminating materials in the semiconductor material. Although other portions of the wafer may be treated to obtain this gettering effect, the use of the base contact is convenient because it normally does not require additional processing steps. In this way it removes these contaminants from the active areas of the semiconductor device, or tends to tie them up in a manner which prevents them from seriously degrading the device. The phosphorus glass which is formed during this diffusion also appears to tie-up the contaminants and produces a very stable protective surface for the device. In addition to producing this protective surface, the phosphorus glass appears to prevent the formation of channels on the surface of the underlying region.

Although the exact nature of the stabilization of the device by this final diffusion is not clearly understood, it is believed that the tendency of phosphorus to getter or attract heavy metals and other contaminating ions in the device is one of the major reasons for the improved device characteristics. It is also thought that this high concentration phosphorus diffusion has a tendency to create dislocations in the semiconductor material which tend to tie-up additional heavy metals and contaminants. The tieing-up of contaminating elements substantially increases the minority carrier lifetime within the base region of this device. Through the increased minority carrier lifetime in the base region it is possible to maintain high betas with much wider base regions than previously available. The effectiveness of this diffusion with phosphorus appears to be partially dependent upon the quality of the diffusion mask deposited upon the semiconductor material.

In one embodiment of this invention, FIG. 1, the various stages of fabricating a silicon power transistor, which is one of many formed on a single silicon substrate, are shown. In FIG. 1A, an N type layer 12 of silicon between about 3 and 30 microns thick is shown after it has been epitaxially deposited upon a P+ type substrate 14 between about 100 and 250 microns thick with a resistivity less than 0.1 ohm-cm. The epitaxial process used to deposit this N type layer 12 is similar to that described previously except that a reducing atmosphere is utilized to deposit the silicon. The thickness of the N type layer 12 is adjusted in accordance with the desired electrical characteristics of the transistor to be constructed. The resistivity of the N type layer 12 deposited in this embodiment is between about .3 and 30 ohm-cm. which yields a $BV_{CBO}$ between about 20 and 300 volts.

FIG. 1B is a representation of the wafer after an N type enhancement diffusion has been performed to create an N type enhancement layer 16 having a higher impurity concentration than epitaxial layer 12. This N type enhancement layer 16 is formed by diffusion, using a phosphorus dopant from a source such as $POCl_3$, to a depth of approximately 2 microns. In this manner the $BV_{EBO}$ of the transistor is adjusted between about 3 and 25 volts. While this diffusion is being performed, an oxide layer 20 is grown on the N type enhancement layer 16. This oxide layer 20 acts as a mask for subsequent diffusions. The N type enhancement layer 16 also tends to increase the ruggedness of collector-base junction 22 and the capabilities of junction 22 to take currents when the transistor is in the avalanche voltage condition. N type enhancement layer 16, in addition, reduces the tendency for secondary breakdown to occur in lightly doped N type layer 12.

Figure 2:
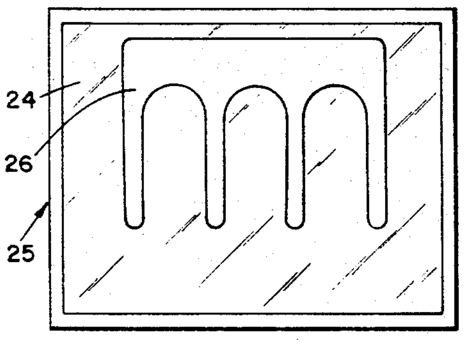
FIG. 2 is an enlarged top view of the device shown in FIG. 1C.

A KMER pattern 24, FIG. 2, is then formed on the surface of the silicon material. KMER is an etch resist material manufactured by Eastman Kodak Company. This is one of many products available which may be used in conjunction with well known photoengraving techniques to define etching patterns and expose portions of etchable materials. The silicon wafer 25 is placed in an etching bath of $NH_4F$ and HF between about 0 and 100° C. and a portion of the glass mask 20 is removed from the area 26 which is not covered by KMER. In this manner the emitter area 26 for the transistor is established.

In FIG. 1C wafer 25 is shown after the exposed emitter area has been subjected to a high concentration P type gaseous diffusion using $BBr_3$ as an impurity source. This diffusion is carried out between about 800 and 1200° C. between about 5 and 60 minutes. The emitter 26 is patterned to yield a large perimeter. This large perimeter produces a transistor with a high current rating. At the conclusion of the emitter diffusion, the basic structure which has been formed will not perform satisfactorily as a power transistor. Further processing steps are required to achieve the characteristics of a practical power transistor.

In FIG. 1D a thick dense glass 30 has been deposited on the surface 34 of wafer 25 by the epitaxial process. This glass 30 is between about 2000 and 15,000 angstroms thick. A sufficient thickness is deposited to provide the necessary diffusion masking for the transistor for subsequent diffusions. Glass 20 previously grown was left on the silicon wafer. A device with substantially the same electrical properties results if this glass 20 is removed.

In the next stage, FIG. 1E, of the fabrication of this device another KMER pattern (not shown) has been formed and openings made for the base contact 36. Base contact region 36 is formed by a high concentration N+ type gaseous diffusion using $POCl_3$ as an impurity source. This diffusion is carried out at a temperature between about 1000 and 1250° C. for between about 5 and 60 minutes. This forms a base contact region 36 and at the same time heavily dopes the protective glass 30 with phosphorus. During this diffusion a thin layer of phosphorus doped glass grows on the exposed base contact region 36. This glass is removed with a buffered etchant and a new glass 38 grown in steam between about 700 and 1000° C. The growing of this steam glass 38 over the base contact region 36 appears to have a significant effect upon the characteristics of the transistor.

Figure 3:
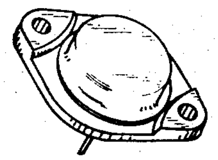
FIG. 3 is a perspective top view of a completed transistor in accordance with the present invention.

The final appearance of the transistor prior to encapsulation is shown in FIG. 1F. To obtain this configuration a KMER pattern (not shown) is formed to define contact areas for the base region 36 and the emitter region 26. These areas are defined in such a way that they did not cause a short circuit by overlapping. After the photoengraving process, openings are etched in oxide 20 and glasses 30 and 38 to expose the silicon material. The KMER is removed and aluminum evaporation is done according to well known metal evaporating techniques. Another KMER pattern (not shown) is applied to the aluminum to outline the desired metallization contact pattern. In this series of photoengraving and etching, a portion of the aluminum metal is removed so that only the base contact 36 and emitter region contact 44 are left covered by the aluminum 42. Again the KMER is removed and a new KMER pattern formed in preparation for the etching of a mesa structure 46. In this step the whole of the transistor is covered with KMER except for the small portion where it is desired to form mesa 46. The surface of the transistor is exposed to an etching solution containing HF, $HNO_3$ and acetic acid for between about 5 and 300 seconds during which time mesa 46 is etched. After mesa 46 is etched the KMER is again cleaned from the surface of the transistor and a chrome-silver metal applied to the collector surface 48 of the transistor. The devices are probed to determine which are properly functioning units, scribed, and broken. These individual transistors are then mounted on a suitable header and connected to the leads of a package to form a completed unit, FIG. 3.

Figure 4:
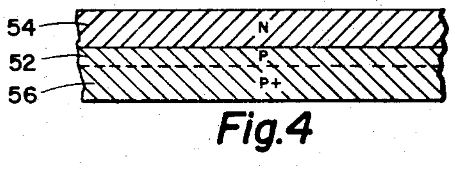
FIG. 4 is an enlarged cross-sectional view of a structure that may be used in the manufacture of a transistor in accordance with another embodiment of this invention.

In another embodiment of this invention, FIG. 4, a P type layer 52 and than an N type layer 54 have been deposited by the epitaxial process on a P+ type substrate 56. It is observed that this intermediate P type layer 52 allows a formation of a transistor having a much higher voltage capability apparently because the high resistivity P type layer increases the depletion region of the transistor. The transistor is then assembled in the same manner as described in the first embodiment.

Figure 5:
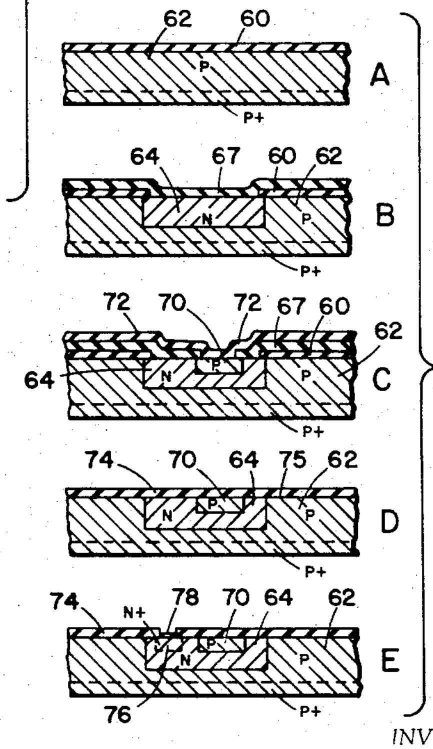
FIG. 5 is a series of cross-sectional views illustrating a semiconductor device at various stages in its manufacture in accordance with a third embodiment of this invention.

In still another embodiment of this invention, FIG. 5, a transistor is formed by a triple diffused process. FIG. 5A in the formation of the triple diffused transistor shows the die after the growth of an oxide layer 60 on a substrate 62 having a P+ and a P type region. This oxide layer 60 is approximately 10,000 angstroms thick and acts as a diffusion mask for later steps in the processing of the transistor. In FIG. 5B, the die is shown after an opening has been etched in oxide layer 60 and a base region 64 formed. This opening is made utilizing KMER and photoengraving techniques. An N type diffusion is performed using $POCl_3$ as an N type impurity source to form base regions 64. During this diffusion a glass 67 is grown over the surface of the exposed base region 64 to mask this region.

In FIG. 5C, an emitter region 70 has been formed and glass 72 grown to protect this region. To form emitter region 70, openings are made in glass 67 and a high concentration P type diffusion is performed using $BBr_3$ as an impurity source. During this diffusion an additional glass 72 is grown over the surface of the emitter region 70. Glass 72 has been found to be inadequate to effectively protect against subsequent diffusions.

To protect emitter region 70 from subsequent N type diffusion, oxide 60 and glasses 67 and 72 are removed by etching and a thick dense glass 74, Step D, 5700 angstroms thick, is epitaxially deposited on surface 75 of the transistor. In Step E an opening for a base contact 76 has been made in deposited glass 74 and the base contact diffusion performed. A high concentration phosphorus diffusion is used to form the base contact 76. This diffusion, performed between about 1000 and 1250° C. for a period between about 5 and 60 minutes, uses $POCl_3$ as an impurity source. In this way, a very heavily doped phosphorus base contact region is formed and glass 74 on the surface of the transistor is phosphorus doped. The phosphorus glass that grows on the base contact region during this diffusion is removed and a new clean steam glass 78 grown. This steam glass 78 further stabilizes and increases the reliability of the device. The transistor is then metallized and encapsulated as described in the first embodiment of this invention.

In the fabrication of integrated circuits the same methods as described in these three embodiments may be used to form a PNP structure. It may be desirable to adjust the processing times, temperatures, and relative layer depths to compensate for the reduced size of the units.

The fabrication of a semiconductor device having alternate PNP type conductivity regions in accordance with the method of this invention results in a device having advantageous features previously not available. Among these advantages is an efficient device having a wide N type base region. Other advantageous features of devices fabricated in accordance with the method of this invention are higher betas and larger DC safe operating areas.

I claim:

1. A method of manufacturing a PNP semi-conductor device having alternate type conductivity regions comprising the steps of depositing a P type semi-conductor layer on a P+ type substrate from a gaseous mixture comprising a gaseous semiconductor compound and a P type dopant, depositing an N type layer having a thickness from 3 to 30 microns on said P type layer from a gaseous mixture comprising a gaseous semiconductor compound and an N type dopant, subjecting a selective portion of said N type layer to a gaseous P type dopant to form a P+ type region therein, depositing a diffusion masking material in intimate contact with said N type layer and a P+ type region therein, removing selected portions of said masking material with $NH_4F$ and HF and as the final diffusion, subjecting said exposed portions and said masking material to a gaseous N type dopant to form an N+ type region in said N type region and wherein said dopant comprises a phosphorus dopant with the diffusion being conducted between 1000° to 1250° C. for a duration of 5 to 60 minutes and then forming an oxide over the entire surface by passing steam thereover with the substrate at a temperature from 700° to 1000° C.

2. A method of manufacturing a semiconductor device having alternate type conductivity regions comprising the steps of passing a gaseous mixture comprising a gaseous semiconductor compound and an N type dopant over a heated P+ type substrate of a semiconductor material to deposit a first N type region of said semiconductor material between about 3 and 30 microns thick thereon, exposing the surface of said first N type region to an N type dopant in a gaseous mixture to form an N+ type region in said first N type region having a higher N type impurity concentration than said first N type region, subjecting the surface of said N+ type region to an oxidizing atmosphere to form an oxide thereon, depositing on said oxide a masking material resistant to a first etching solution for said oxide in a pattern exposing a selected first region of said oxide, subjecting said selected first region to said first etching solution to remove a portion of said oxide, removing said masking material, exposing the surface with said oxide and selected first region to a P type dopant in a gaseous mixture at a temperature between about 800° and 1200° C. for a period of between about 5 and 60 minutes, depositing a layer of $SiO_2$ between about 2000 and 15,000 angstroms thick on said oxide, N type region and stubstrate from a gaseous mixture comprising $SiCl_4$, depositing on said $SiO_2$ a masking material resistant to said first etching solution and a second etching solution comprising $NH_4F$ and HF, in a pattern exposing a selected second region of said $SiO_2$, subjecting said seletced second region to said first and second etching solutions to remove said $SiO_2$ and oxide from said selected second regions, removing said masking material, exposing said selected second region to a phosphorus dopant in a gaseous mixture at a temperature between about 1000° and 1250° C. for between about 5 and 60 minutes, subjecting said selected second region to a buffered etching soltuion to remove oxide grown on said selected second region, and growing an oxide on said selected second region by passing steam over said selected second region at a temperature between about 700 and 1000° C.

3. A method of manufacturing a semiconductor device having alternate type conductivity regions comprising the steps of passing a gaseous mixture comprising a gaseous semiconductor compound and an N type dopant over a first surface of a heated substrate of P+ type semiconductor material to deposit a first N type region of semiconductor material between about 3 and 30 microns thick on said first surface, exposing the surface of said first N type region to an N type dopant in a gaseous mixture to form an N+ type region in said first N type region having a higher N type impurity concentration than said first N type region, subjecting the surface of said N+ type region to an oxidizing atmosphere to form an oxide thereon, depositing on said oxide a masking material resistant to a first etching solution for said oxide in a pattern exposing a selected first region of said oxide, subjecting said selected first region to said first etching solution to remove said oxide, removing said masking material, exposing the surface with said oxide and selected first region to a P type dopant in a gaseous mixture at a temperature between about 800° and 1200° C. for between about 5 and 60 minutes to form a P+ type region, depositing a layer of $SiO_2$ between about 2000 and 15,000 angstroms thick on said P+ type region, oxide, N type region, and substrate from a gaseous mixture comprising $SiCl_4$, depositing on said $SiO_2$ a masking material resistant to said first etching solution and a second etching solution comprising $NH_4F$ and HF in a pattern exposing a selected second region of said $SiO_2$, subjecting said selected second region to said first and second etching solutions to remove said $SiO_2$ and oxide from said selected second region, removing said masking material, subjecting said selected second region to a phosphorus dopant in a gaseous mixture at a temperature between about 1000° and 1250° C. between about 5 and 60 minutes, subjecting said selected second region to a buffered etching solution to remove oxide grown on said selected second region, passing steam over said selected second region at a temperature between about 700° and 1000° C. to grow a second oxide on said selected second region, depositing a masking material resistant to said first and second etching solutions on said $SiO_2$ and second oxide in a pattern exposing a selected third region, subjecting said selected third region to said first and second etching solutions to remove said $SiO_2$ and second oxide from said selected third region, removing said masking material, removing an N type region formed when said second region was exposed to said phosphorus dopant from a second surface opposed said first surface, depositing aluminum on said $SiO_2$ and oxide to make electrical contact with said selected third region, removing a portion of said conductor, depositing on said $SiO_2$, second oxide and aluminum, a masking material resistant to an etchant for said $SiO_2$, second oxide, aluminum, and semiconductor in a pattern exposing a selected fourth region, subjecting said masked surface to said etchant for $SiO_2$, second oxide, aluminum and semiconductor to form a mesa structure, and depositing a metal on said second surface.

References Cited

UNITED STATES PATENTS

| | | | |
|---|---|---|---|
| 2,995,473 | 8/1961 | Levi. | |
| 3,067,485 | 12/1962 | Ciccolella | 148—186 X |
| 3,140,965 | 7/1964 | Reuschel | 148—1.5 X |
| 3,145,447 | 8/1964 | Rummel. | |
| 3,194,701 | 7/1965 | Lothrop | 148—189 |
| 3,226,614 | 12/1965 | Haenichen | 148—186 |
| 3,235,428 | 2/1965 | Naynik | 148—1.5 |
| 3,055,776 | 9/1962 | Stevenson. | |
| 3,183,128 | 5/1965 | Leistiko | 148—187 X |
| 3,223,904 | 12/1965 | Warner | 148—175 X |
| 3,316,131 | 4/1967 | Wisman | 148—175 X |

HYLAND BIZOT, *Primary Examiner.*